US006857552B2

(12) United States Patent
Wong

(10) Patent No.: US 6,857,552 B2
(45) Date of Patent: Feb. 22, 2005

(54) METHOD AND APPARATUS FOR MAKING SMART CARD SOLDER CONTACTS

(75) Inventor: Chi Ming Wong, Scarborough (CA)

(73) Assignee: Intercard Limited, Hong Kong (CN)

( * ) Notice: Subject to any disclaimer, the term of this patent is extended or adjusted under 35 U.S.C. 154(b) by 102 days.

(21) Appl. No.: 10/414,768

(22) Filed: Apr. 17, 2003

(65) Prior Publication Data

US 2004/0206799 A1 Oct. 21, 2004

(51) Int. Cl.$^7$ .............................................. B23K 31/02
(52) U.S. Cl. ...................... 228/52; 228/49.5; 219/56.21
(58) Field of Search .......................... 228/1.1, 4.5, 33, 228/49.5, 51, 52, 53, 110.1, 180.5, 207, 256, 257; 219/56.21, 56.22, 119, 243; 29/729, 745, 831; 156/230; 235/488, 492; 257/679, 737, 789

(56) References Cited

U.S. PATENT DOCUMENTS

| | | | | | |
|---|---|---|---|---|---|
| 4,171,477 | A | * | 10/1979 | Funari ...................... | 219/56.21 |
| 4,737,620 | A | * | 4/1988 | Mollet et al. ............... | 235/492 |
| 5,510,074 | A | * | 4/1996 | Rose .......................... | 264/261 |
| 5,786,626 | A | * | 7/1998 | Brady et al. ................ | 257/673 |
| 5,951,810 | A | * | 9/1999 | Tarantino .................... | 156/293 |
| 6,028,774 | A | * | 2/2000 | Shin et al. ................... | 361/764 |
| 6,566,163 | B1 | * | 5/2003 | Laroche et al. ............. | 438/106 |
| 2003/0020182 | A1 | * | 1/2003 | Blanc et al. ................ | 257/789 |
| 2003/0024103 | A1 | * | 2/2003 | Kiguchi et al. .............. | 29/601 |
| 2003/0132302 | A1 | * | 7/2003 | Hattori ....................... | 235/492 |
| 2004/0089408 | A1 | * | 5/2004 | Brod et al. ................. | 156/230 |

FOREIGN PATENT DOCUMENTS

JP          2003-197284        *  7/2003

* cited by examiner

*Primary Examiner*—Jonathan Johnson
(74) *Attorney, Agent, or Firm*—David W. Wong

(57) ABSTRACT

A method and apparatus for soldering terminal ends of an antenna embedded in a plastic smart card to contact terminals of an IC module disposed on the card are shown. The enamel coated antenna terminal ends are pre-coated with solder with a heater having horizontal opening with melted solder retained therein. The solder pre-coated terminal ends are maintained in a secured contact with the terminal contacts of the IC module by heating coils mounted at a free front end of two pivotal elongated cantilever arms. A piece of predetermined amount of solder is dropped into the cavity of each heating coil, and the heating coils are actuated with a low electrical current to generate a concentrated intense heat to melt the piece of solder to form secure permanent solder joints between the terminal ends of the antenna to the contact terminals of the IC module.

9 Claims, 5 Drawing Sheets

METHOD AND APPARATUS FOR MAKING SMART CARD SOLDER CONTACTS

FIELD OF THE INVENTION

This invention relates to a method and apparatus for making solder connections at terminal contacts in electrical components imbedded or inlaid in a plastic substrate; and more specifically for making solder connections at terminal contacts of a circuit module in a Smart card such as a contactless card, or combi card and the like.

BACKGROUND OF THE INVENTION

In the fabrication of a smart card such as a contactless card or combi card in which the electrical components such as the antenna and a small IC module such as a thin microprocessor circuit which carries all the identification information and/or data, are embedded in a plastic supporting card base or substrate commonly made of PVC or other plastic material. The antenna consists of a plurality of windings of fine enamel coated magnet wire laid around or embedded into the edge portions of the supporting card. The terminal ends of the antenna are subsequently connected to the contact terminals of the IC module by soldering prior to affixing the IC module to the card with adhesive. It has been extremely problematic in carrying out the soldering operation of the antenna terminal ends to the IC module contact terminals due to firstly that the contact terminals of the IC module are very small in physical size which is typically less than three square millimeter; and secondly that the fine enamel coated magnet wire of the antenna is extremely difficult to handle and to maintain in a fixed position at the contact terminals of the IC module while they are being soldered with a soldering iron, and also in the meantime, having to place solder to the heated contacts to carry out the soldering operation. Thus, the soldering operation requires extremely high dexterity to carry out these various tasks simultaneously and manually. Moreover, the operation is further complicated by the low melting point of the plastic card base such that any prolong contact or exposure of the plastic card and/or the substrate to the heated soldering iron tip in the soldering process would invariably cause detrimental deformation of the plastic material to render the card not unacceptable.

Another problem is the necessity of pre-coating the terminal ends of the antenna magnet wire with solder in order to facilitate soldering them to the IC module contact terminals. The enamel coating of the magnet wire may not be physically stripped due to its fine gauge size which is typically about AWG 38; furthermore, only a short length of the antenna terminal ends is reserved for making the connection to the module during fabrication, such short length is not conducive for stripping by mechanical means. The enamel coating on the terminal ends of the magnet wire antenna must first be removed so that a coating of solder flux material may be applied thereon prior to using the heated soldering iron to form the solder coating on the wire. Commonly, the removal of the enamel coating and the application of solder coating on a an enamel coated magnet wire may be carried out simultaneously by applying the solder flux over the enamel coating and then applying heat from the soldering iron or dipping the flux coated wire vertically into a heated pod containing melted solder such that the melted solder would break down the enamel coating as well as would coat the wire with solder simultaneously. However, such methods may not be employed for pre-coating the terminal ends of the antenna magnet wire embedded in the plastic card base of an identification card, since the plastic card would invariably be deformed by the heat of the solder pod when the card is placed close vertically above the latter. Even applying the pre-coating solder to the antenna terminal ends with a soldering iron is rather skill challenging because of the close proximity of the heated soldering iron tip to plastic card and the plastic substrate of the IC module.

SUMMARY OF THE INVENTION

It is a principal object of the present invention to provide a method and an apparatus which are operative for soldering the terminal ends the fine magnet wire to the IC module contact terminals on a plastic card substrate easily and quickly.

It is another object of the present invention in providing a device for stripping and applying a solder coating to end portions of the enamel coated fine magnet wire of the antenna terminal ends in a plastic card base in the fabrication of an identification card.

It is yet another object of the present invention to provide a soldering apparatus which operates with very low electrical power.

It is still another object of the present invention to provide a soldering apparatus which is simple in structure and easy to operate.

BRIEF DESCRIPTION OF THE DRAWINGS

Other objects and advantages of the present invention will become apparent from the following detailed description of the preferred embodiments thereof in connection with the accompanying drawings, in which.

DETAILED DESCRIPTION OF THE PREFERRED EMBODIMENT

Figure 1:
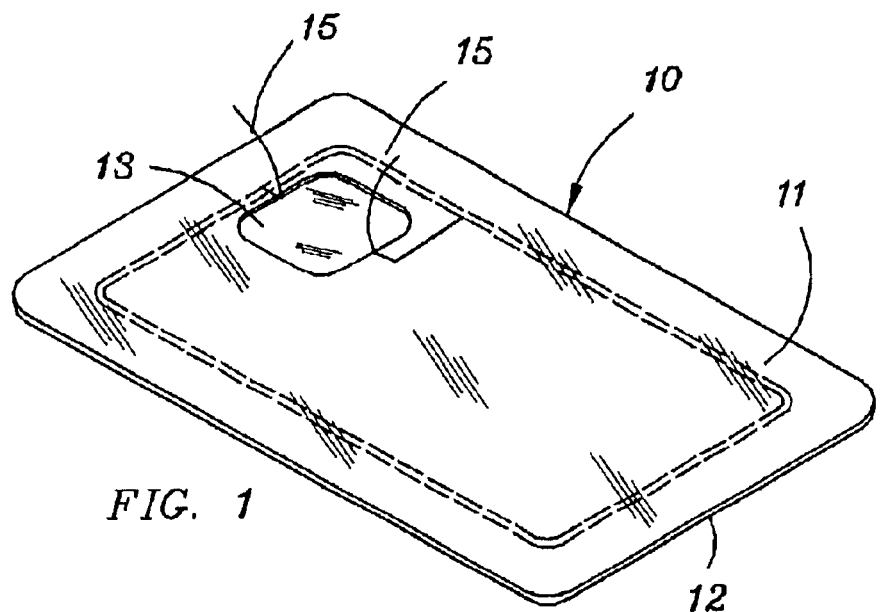
FIG. 1 is a perspective elevation view of a PVC plastic card base with the enamel coated magnet wire antenna coil embedded around the edge portions therein with its short terminal end portions extending outward from a depression adapted for accommodating an IC module.
Figure 2:
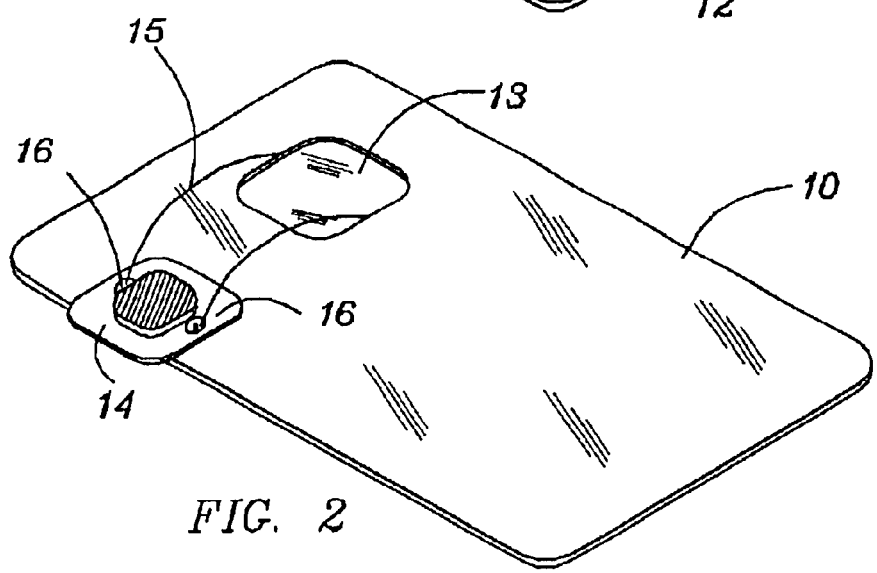
FIG. 2 is a perspective elevation view showing the connection of the antenna terminal ends to the contact terminals of the IC module.

With reference to the drawings wherein like reference numerals designate corresponding parts in the several views, a smart card such as a contactless or combi card 10 has fine magnet wire coil windings 11 embedded in the edge portions of a plastic card 12 made commonly of PVC or ABS plastics or a combination of such materials. The coil windings 11 form the antenna for transmitting stored data from an IC module to a receiver when the combi card 10 is placed adjacent to the sensor of the receiver during use of the combi card 10. The fine magnet wire typically is only about 38 AWG in size. A rectangular depression 13 is provided in the card 10 for accommodating an IC module 14 which, depending on the application of the smart card, carries the electronic data such as personal identification, transactions, account balance etc. A short length of the terminal end portions 15 of the antenna coil windings 11 extends outwards into the depression 13 for making connection to the module 14 in the fabrication of the combi card 10. The IC module 14 is an integrated circuit chip provided on a plastic substrate made commonly also of PVC and/or ABS plastic material or glass epoxy or a semiconductor material. Printed circuit contact terminals 16 are formed on the underside of the IC module substrate for connection with the terminal ends of the antenna. Each contact terminal 16 has a very small physical size of typically about 3 square mm or 2 mm diameter.

In the fabrication of the combi card 10, the terminal ends 15 of the antenna are secured to the contact terminals 16 by soldering so as to form secure permanent electrical connections. Once the connections are made, the IC module 14 is flipped upright to locate in the depression 13, and it is fixedly mounted in place with adhesive such as epoxy.

The soldering of the antenna terminal ends to the contact terminals of the module 14 has been carried out by using a soldering iron. Such operation, has been extremely awkward and difficult to carry out because of the delicacy of the fine magnet wire of the antenna coil and the extremely small physical size of the contact terminals of the module 14 such that it is extremely challenging to maintain the magnet wire ends in place on the contact terminals while manually applying solder to the connections with a hot soldering iron. The operation is further complicated by the low melting point of the PVC and/or ABC plastic material of the plastic card base of the combi card. The melting point of the PVC and/or ABS material is typically about 120° C. while the melting point of the solder is about 160° C. Thus, in order to apply sufficient heat to melt the solder during the soldering operation, the plastic card 10 would easily be deformed by even a relatively short exposure to the heated soldering iron, so that the soldering process must be carried out expeditiously yet sufficiently in order to obtain a good quality solder joint.

Figure 5:
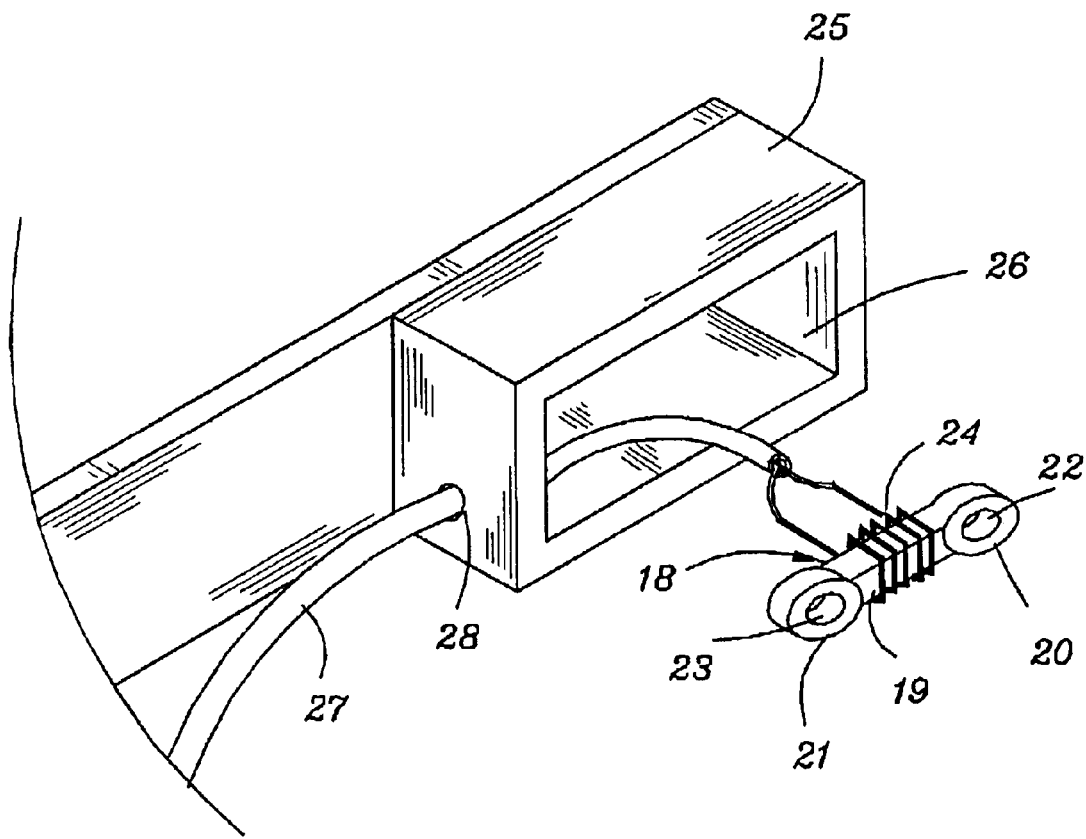
FIG. 5 is an isolated enlarged exploded elevation view of the heater device for applying a solder coating to the end portions of the enamel coated fine gauge magnet wire of the antenna embedded in the plastic card base of the identification card.

The present invention eliminates the above drawbacks by first coating the end portions 15 of the antenna wire on the card 10 with a stripping and coating device 17 as best shown in FIG. 5. The stripping and coating device 17 has a heater core 18 made of a metal such as copper or brass having affinity to solder. The heater core 18 has a central bar portion 19 and two larger end portions 20 and 21 which may be cylindrical in shape. Two horizontal through openings 22 and 23 about 2 mm in diameter are formed in these end portions 20 and 21 respectively. A heating wire 24 is wound on the central bar portion 19. The heater core 18 is located in a heat insulating ceramic housing 25 in a horizontal position such that the openings 22 and 23 are accessible through the front opening 26 of the ceramic housing 25. The heating wire 24 is connected to an electrical supply by electrical wire 27 extending outside of the ceramic housing 25 through a side opening 28 formed either at the side wall of the ceramic housing as shown or alternatively through the rear wall therein. The distance between the openings 22 and 23 of the heater core 18 is equal to the distance between the terminal ends of the antenna wire on the combi card 10. The heating wire 24 is energized with an electrical power supplied to it by the electrical wire 27 so as to heat the heater core 18. Due to the small physical size of the heater core 18 only 5 watts of electrical power is sufficient to maintain the heater core at a temperature of about 400° C. Once the heater core 18 has been heated to the operating temperature, solder may be melted and drawn into the horizontal openings 22 and 23 by touching it to the openings 22 and 23. Melted solder would be automatically drawn into the cavity of these horizontal openings due to the affinity of the copper material with the melted solder so that the solder is maintained in the melted form within the openings 22 and 23 as long as the heater core is heated.

The enamel coated end portions of the antenna wire 15 may be easily stripped and coated with solder by simply first applying a coat of solder flux on these end portions of the antenna wire and then locating the combi card 10 below the stripping and coating device 17 in a spaced manner with the terminal ends of the antenna magnet wire bent 90 degrees so that they may be inserted into the melted solder filled cavity the openings 22 and 23 of the heater core 18 of the stripping and coating device 17. The melted solder within the openings 22 and 23 maintained at about 400° C. would cause the enamel coating to break down and to be removed and then would coat the clean metal wire surface of these end portions with solder simultaneously. The operation is almost instantaneous, and the heat of the stripping and coating device 17 is insulated from the combi card 10 located below the latter by the ceramic housing 25 such that the plastic card base of the combi card is not exposed to the heat of the heater core 18 of the stripping and coating device 17 to cause any deformation in the card.

Two soldering heads 29 and 30 are provided for both locating the solder coated terminal ends of the antenna wire on the contact terminals 16 of the IC module 14 as well as soldering these connections. The soldering heads 29 and 30 are mounted at the front ends 31A and 31B of two elongated pivotal cantilever arms 32 and 33 respectively. A heating coil 34 is mounted at the front end of the solder heads 29 and 30. The heating coil 34 is made of a heating wire such as a tungsten filament wire which may be energized by a very low electrical current of about 1 to 1.5 ampere supplied to it by electrical wire 35 to generate the heat required to melt the solder material. The tungsten wire is inert to solder such that the solder would not adhere to it after the heating wire is de-energized. The heating wire coil 34 has a diameter equal to or smaller than the diameter of the contact terminals of the IC module 14 so that the heat generated by the coil is concentrated at the contact terminals 16 of the IC module 14.

Figure 6:
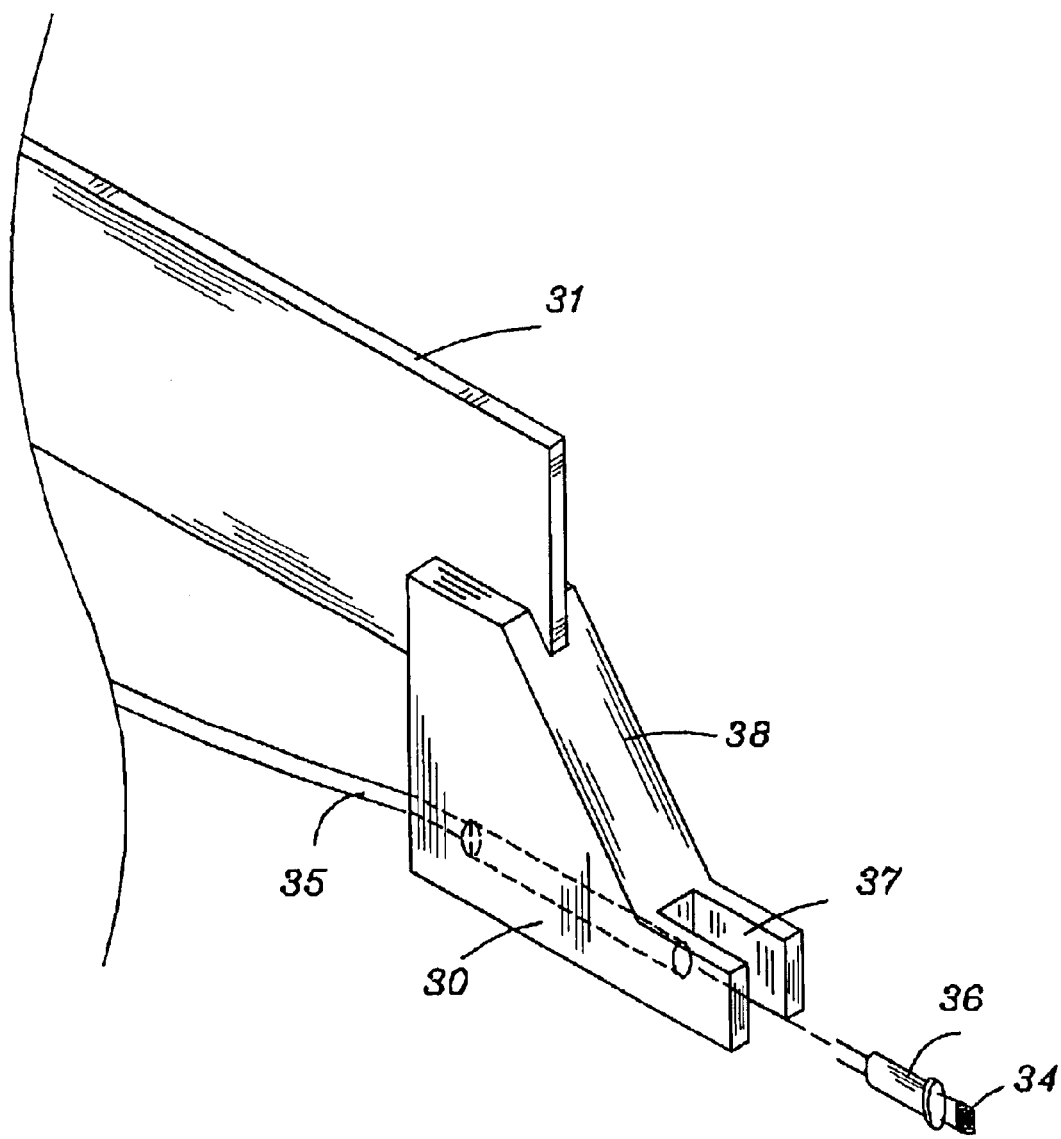
FIG. 6 is an isolated enlarged exploded elevation view of the solder head mounted at the front end of an elongated pivotal cantilever arm of the present invention.

Each of the solder heads 29 and 30 may be constructed in an embodiment as best shown in FIG. 6. The heating wire coil 34 is mounted on a heat insulating holder 36 which is, in turn, mounted to a U-shaped front end 37 of a supporting block 38. The supporting block 38 is mounted to the front end of the elongated pivotal cantilever arms 32 and 33.

Figure 3:
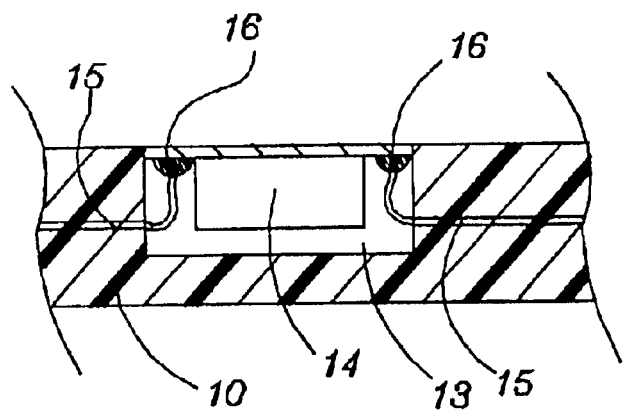
FIG. 3 is an isolated enlarged partial sectional side elevation view of the depression of the smart card showing the antenna ends soldered to the contact terminals of the IC module.
Figure 7:
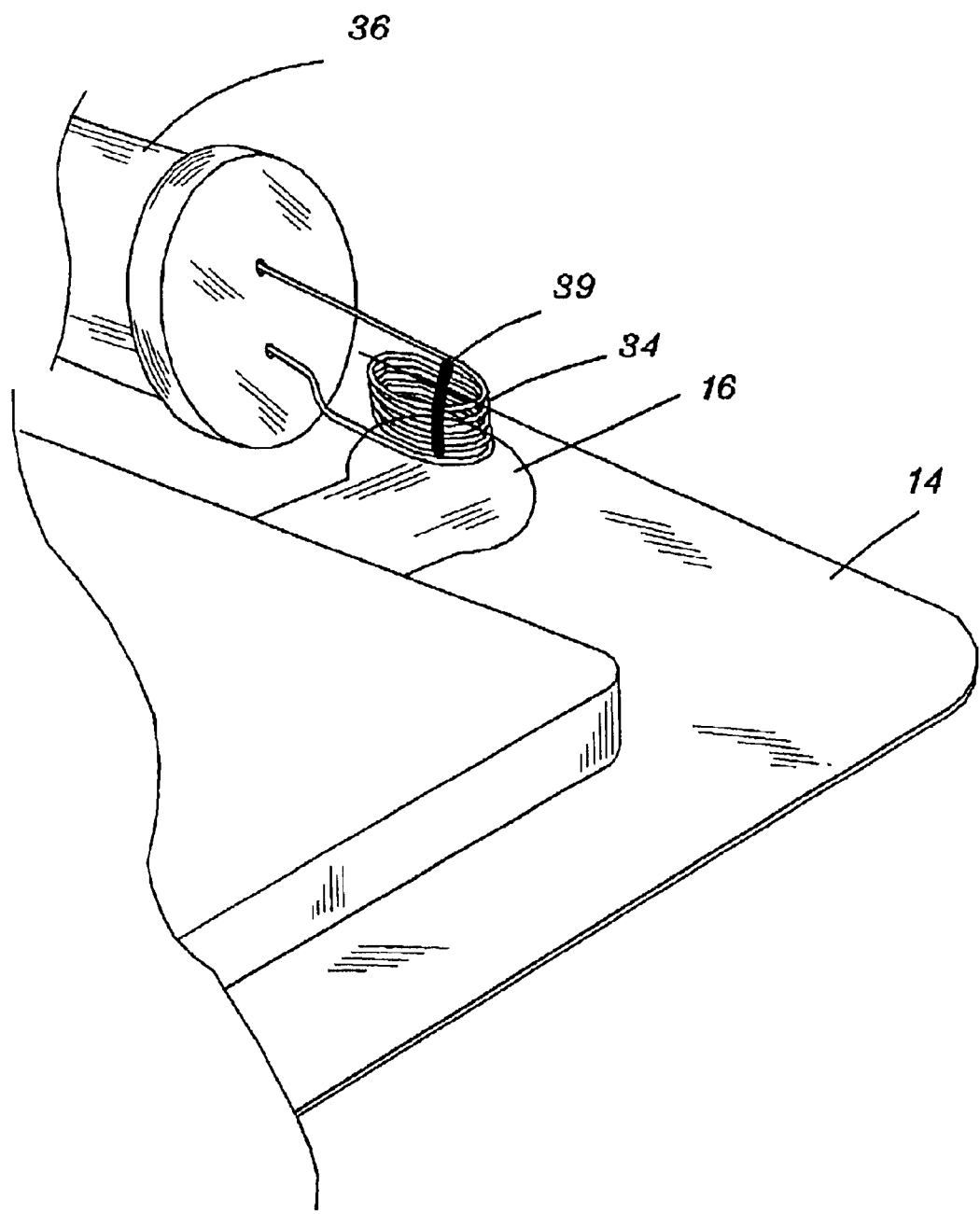
FIG. 7 is an isolated enlarged elevation view showing the placement of a piece of solder to terminal contact of the IC module within the cavity of the heater coil according to the present invention.

To solder the terminal ends of the antenna wire to the contact terminals of the module 14, the module 14 is first placed on the card 10 adjacent to the depression 13 in an upside down position with the contact terminals facing upwards. The card 10 is then located in a position in which when the pivotal arms 32 and 33 are lowered, the heating wire coil 34 therein will align with the contact terminals of the module 14. The solder coated antenna terminal ends 15 are bent to position over the contact terminals 16 of the module 14; and the pivotal arm 32 and 33 are then lowered such that the heating wire coil 34 of each solder head would press and maintain the terminal ends of the antenna wire securely in place at the contact terminals 16 of the module 14. The weight of the supporting block 38 modified by the spring characteristics of the heating wire coil 34 provides a suitable force for maintaining the terminal ends of the antenna wire securely in place at the contact terminals of the module 14. Thus it greatly alleviates the unwieldy problem of the conventional soldering operation of having manually to maintain the antenna terminal ends securely in place at the contact terminals of the module while at the same time having to place solder material to the contact terminals as well as to apply heat to the contact terminals with the heated soldering iron. As best shown in FIG. 7, with the present invention, the soldering operation may be quickly and simply carried out by dropping a small piece of solder 39 of a predetermined amount into the heating wire coil 34, followed by energizing the heating wire coil 34. Due to the intense heat generated by the heating wire coil 34 in which the heat is isolated and concentrated within the cavity of the coil, the solder 39 located inside the coil would melt instantaneously. The heating wire coil 34 would then be de-energized to complete the soldering process of the terminal ends of the antenna wire to the contact terminals of the module 14. The heating wire coil 34 is required to be energized briefly for only one to two seconds to carry out the process. The heat generated by the brief energization of the heating wire coil 34 does not have sufficient time to spread to the plastic substrate of the module as well as the plastic card 10. Furthermore, the heating wire coil 34 would cool instantaneously as soon as the electrical power is turned off. After the connections have been soldered, the pivotal arms 32 and 33 may be raised to remove the combi card 10 from the soldering station. The IC module 14 may then be flipped right side up and be located into the depression 13 as best shown in FIG. 3. The IC module 14 may be securely mounted in the depression 13 with adhesive such as epoxy.

Figure 4:
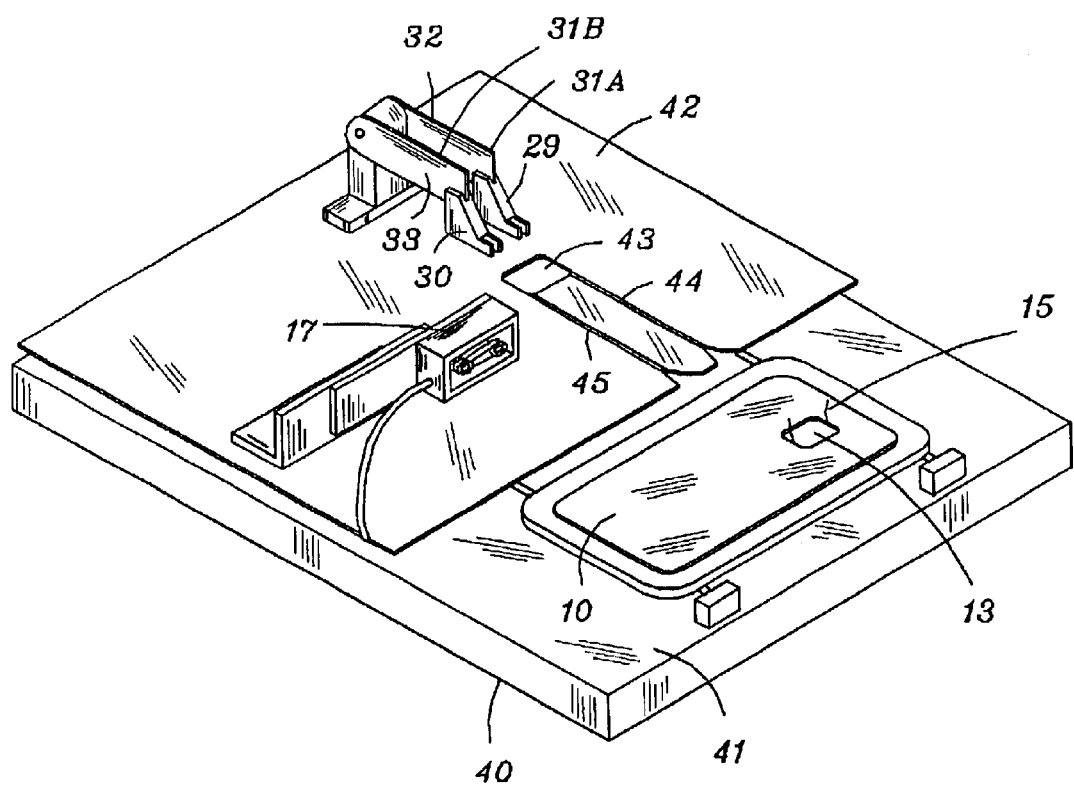
FIG. 4 is a perspective elevation view of an embodiment of the apparatus of the present invention for soldering the antenna ends to the contact terminals of the IC module.

The stripping and coating device 17 and the soldering heads 29 and 30 may be provided on a fixture base 40 to form an integral device as best shown in FIG. 4 to facilitate the above soldering process. The fixture base 40 has a rectangular platform 41. A rectangular upper deck 42 is located to one side of the base 40 such that the card 10 may be located on the other portion of the platform 41 as shown. The upper deck is spaced above the platform 41 such that the card 10 may be slidably positioned below the upper deck to locate between the upper deck 42 and the platform 41. A rectangular opening 43 is formed in the upper deck 42 such that when the card 10 is slidably inserted under the upper deck 42, the IC module 14 and the antenna terminal ends 15 are exposed in the opening 43 in the upper deck 42 to facilitate the soldering operation and the upper deck provides a protection to the card 10. The elongated cantilever arms 31 and 32 of the soldering heads 29 and 30 are mounted on the upper deck 42 such that when they are lowered, the heating wire coil 34 of the soldering heads 29 and 30 will align with the contact terminals 16 of the module 14. Two elongated slots 44 and 45 are formed in the upper deck 42, which extend from the rectangular opening 43 to the side edge of the upper deck 42 so that the antenna terminal ends 15 may not be disturbed while the card 10 is being slidably positioned under the upper deck 42.

The pre-coating of the antenna terminal ends 15 with solder and subsequently soldering them to the contact terminals of the IC module 14 may all be carried out quickly and easily with the fixture 40.

Without further analysis, the foregoing will so fully reveal the gist of the present invention by the exemplary embodiments that others can, by applying current knowledge, readily adapt it for various application without omitting features that, form the standpoint of prior art, fairly constitute essential characteristics of the generic or specific aspects of this invention and, therefore, such adaptations should and are intended to be comprehended within the meaning and range of equivalence of the following claims.

What is claimed is:

1. An apparatus for soldering a terminal end of a fine electrical wire embedded in a plastic card to a contact terminal of an integrated circuit chip disposed on said plastic card, comprising
   a supporting platform operative for supporting said plastic card during soldering,
   an elongated cantilever arm pivotally mounted on said platform,
   a heating coil mounted at a free end of said cantilever arm, said cantilever arm being operative for pressing said terminal end securely on said contact terminal, said heating coil having a central cavity operative for accepting a predetermined amount of solder to be placed on said contact terminal through said cavity, and said heating coil being operative to generate a concentrated intense heat within said cavity to cause said solder to melt and to form a permanent joint between said terminal end and said contact terminal.

2. An apparatus according to claim 1 wherein said heating coil is a tungsten filament coil operative with a low electrical current to generate said concentrated intense heat in said cavity.

3. An apparatus according to claim 2 wherein said electrical wire is an enamel coated fine magnet wire and said apparatus includes a pre-soldering station mounted on said platform, said pre-soldering station having a heat insulated housing with a heater mounted therein, said heater having a metal block with a horizontal opening formed therein, said horizontal opening being accessible through a front opening of said housing and being operative to maintain melted solder therein, said card being disposable below said pre-soldering station with said terminal end pre-coated with a solder flux material and extending upright and bent sideways to insert into said horizontal opening for applying a coating of solder on said terminal end prior to soldering to said contact terminal.

4. An apparatus for soldering terminal ends of an antenna winding of enamel coated fine magnet wire embedded in a plastic card to contact terminals of an IC module disposed on said plastic card, comprising
   a platform adapted to support said plastic card during soldering of said terminal ends to said contact terminals of said IC module,
   a solder pre-coating station disposed on said platform, said pre-coating station including a metal heater core made of a metal with affinity to solder and located in a heat insulated housing having a front opening, said heater core having two horizontal openings operative for retaining solder in a melted condition therein, said pre-coating station being operative for applying a coating of solder on said terminal ends having a solder flux material already applied thereon, and said terminal ends extending in an upright position and bent sideway to insert into said horizontal openings of said heater core,
   two elongated cantilever arms pivotally mounted on said platform, said arms having a heating coil mounted on a free end therein, and said arms being operative to locate said heating coil therein for pressing said terminal ends securely on said contact terminals of said module, said heating coil of each of said arms having a central cavity and adapted to receive a piece of solder of a predetermined amount to be disposed therein over said contact terminals, and said heating coil being operative to generate a concentrated intense heat for melting said piece of solder for soldering said terminal ends precoated with solder, to said contact terminals.

5. An apparatus according to claim 4 wherein said heating coil is a tungsten filament coil operative with a low electrical current to generate said intense heat within said cavity therein.

6. An apparatus according to claim 5 wherein said heating coil is mounted to said front end of said cantilever arms with a heat insulation head member.

7. An apparatus according to claim 6 wherein said heater core includes two round shaped end portions and a central bar section, said horizontal openings being formed in said round shaped end portions, and an electrically operated heater winding provided on said central bar section.

8. An apparatus according to claim 7 wherein said elongated cantilever arms are mounted on an upper deck located in a space manner over said platform, said upper deck having a fabrication opening formed therein, said plastic card being slidably disposable under said upper deck with said terminal ends and contact terminals exposed in said fabrication opening.

9. An apparatus according to claim 8 including two parallel slots formed in said upper deck and extending from a front edge of said upper deck to said fabrication opening, said slots adapted to facilitate sliding positioning of said plastic card under said upper deck to locate said terminal ends and contact terminals in said fabrication opening.

* * * * *